United States Patent [19]
Holman

[11] Patent Number: 5,856,987
[45] Date of Patent: *Jan. 5, 1999

[54] ENCODER AND DECODER FOR AN SEC-DED-S4ED ROTATIONAL CODE

[75] Inventor: Thomas J. Holman, Portland, Oreg.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 801,617

[22] Filed: Feb. 18, 1997

Related U.S. Application Data

[63] Continuation of Ser. No. 535,782, Sep. 28, 1995, abandoned, which is a continuation of Ser. No. 176,351, Dec. 30, 1993, abandoned.

[51] Int. Cl.⁶ .................................................. H03M 13/00
[52] U.S. Cl. ..................... 371/37.01; 371/37.03; 371/37.08; 371/37.11; 371/37.12
[58] Field of Search .................. 371/37.1, 37.6, 371/37.8, 38.1, 39.1, 40.1, 37.11, 37.12, 37.2, 37.4, 37.5, 40.11, 37.08

[56] References Cited

U.S. PATENT DOCUMENTS

| | | | |
|---|---|---|---|
| 3,825,893 | 7/1974 | Bossen et al. | 371/37.6 |
| 4,509,172 | 4/1985 | Chen | 371/37.8 |
| 4,692,922 | 9/1987 | Kiriu et al. | 371/37.03 |
| 5,040,179 | 8/1991 | Chen | 371/37.8 |

OTHER PUBLICATIONS

Rao, T.R.N. & E. Fujiwara: Error–Control Coding for Computer Systems, 1989, pp. 221–299.

Primary Examiner—Emmanuel L. Moise
Attorney, Agent, or Firm—Blakely, Sokoloff, Taylor & Zapman LLP

[57] ABSTRACT

A computer system employs a SEC-DED-S4ED rotational error control code (ECC) wherein all columns of H matrix are linearly independent and have an odd weight, and are arranged to allow detection of 4-bit byte errors. The ECC includes check bits arranged in a specific manner in designated columns of the matrix to permit detection and correction of single bit errors, as well as detection of double, triple and quadruple bit errors. The computer system employing the ECC also includes a data path having a variety of implementations; e.g., a single 72-bit path, two 36-bit paths, or a single 36-bit path.

9 Claims, 8 Drawing Sheets

$$G = [I_k \, P] = \begin{bmatrix} 1 & 0 & 0 & \cdots & 0 & | & P_{0,0} & & P_{0,n-k-1} \\ 0 & 1 & 0 & \cdots & 0 & | & & & \\ & \vdots & & & & | & & \vdots & \\ 0 & 0 & 0 & \cdots & 1 & | & P_{k-1,0} & & P_{k-1,n-k-1} \end{bmatrix}$$

Figure 1(a)
Prior Art

$$H = [-P^T \, I_r] = \begin{bmatrix} -P_{0,0} & \cdots & -P_{k-1,0} & | & 1 & 0 & 0 & \cdots & 0 \\ & & & | & 0 & 1 & 0 & \cdots & 0 \\ & & & | & & \vdots & & & \vdots \\ -P_{0,n-k-1} & \cdots & -P_{k-1,n-k-1} & | & 0 & 0 & 0 & \cdots & 1 \end{bmatrix}$$

ENCODER AND DECODER FOR AN SEC-DED-S4ED ROTATIONAL CODE

This is a continuation of application Ser. No. 08/535,782, filed Sep. 28, 1955, now abandoned, which is a continuation of application Ser. No. 08/176,351, filed Dec. 30, 1993, now abandoned.

BACKGROUND OF THE INVENTION (1) Field of the Invention

The present invention relates to the field of error detecting and correcting codes for a computer system.

(2) Prior Art

Digital computers work with binary coded information wherein data is represented in the computer as pieces of information forming electrical high and low states corresponding to logical ones and zeros. In the storage and transmission of these electrical states within a computer system, a variety of problems may cause an electrical state to be altered into its inverse state. To ensure proper performance, it is important to be able to detect these errors and also advantageous to be able to correct such errors. However, in any error checking and correcting scheme there are at least two conflicting priorities. First, the scheme must be as simple and compact as possible so as not to unduly add to the complexity to the system (i.e., the hardware circuitry) or decrease its speed. Second, the scheme should be capable of detecting all expected errors while correcting as many errors as possible.

Numerous examples of error checking and correcting schemes are well-known in the art. One of the simplest is the use of parity bits to detect single bit errors in a stream of data. The use of a single parity bit will detect single bit errors in a code word, but is incapable of correcting single bit errors and cannot detect double bit errors.

To detect multiple errors and/or correct errors, some codes utilize multiple parity (check) bits. When the resulting code is formed of code words which are a subset of the n-tuples over a finite field GF(q) of q symbols, the code is referred to as a "linear code". This patent is concerned with linear codes where q=2.

A linear code can be described in two ways: By its generator matrix G or by its parity matrix H. The general systematic form of these matrices is shown in FIGS. 1(a) and 1(b), respectively. Either matrix defines the set of code words that form the code. The code word length is n=(r+k) bits, where r is the number of check bits and k is the number of data bits. A code is typically specified by the notation: (n, k).

The basic scheme for generating and decoding code words is shown in FIG. 2. As shown, the code word $v=(v_0, v_1, \ldots v_{n-1})$ is formed by calculating the dot product between the k-bit input data word $d=(d_0, d_1, \ldots d_{k-1})$ and the generator matrix G. Once the code v has been generated, it is subsequently transmitted between system components (e.g., read out of memory) and must then be decoded in order to determine whether the output data word $d'=(d_0', d_1', \ldots, d_{k-1}')$ contains the same data bits as the input data word d. To determine whether the output data word d' correctly reflects the input data word d, a syndrome s is generated for the code word v. This is done by calculating the dot product between the code word v and the transpose of the G matrix, H, so as to obtain $s(v)=(s_0, s_1, \ldots, s_{n-1})=v \cdot H$. The syndrome is used to classify errors found in the output data word d'. If the syndrome s(v)=0, then it is assumed that there are no data bit errors in the output data word d'. If the syndrome s(v)≠0, then errors are detected.

The G matrix represents the operations needed to generate the check bits of a code. The combinational logic to carry out these operations, i.e., to generate the check bits for the input data word d to obtain a systematic code word v, is shown in FIG. 3(a). The H matrix represents the operations needed to generate the syndrome bits of a code. The combinational logic to carry out these operations, i.e., to generate the syndrome bits s for the code word v, is shown in FIG. 3(b).

If a code is capable of correcting errors, the syndrome is used both to classify the error as correctable or uncorrectable, and to identify the output data word positions that are in error. For example, a code can correct single bit errors if all columns of its H matrix are non-zero and distinct. If the syndrome matches any one of these column vectors the error is assumed to be correctable with the error occurring at the bit position corresponding to the match.

A code that is capable of correcting single bit errors and detecting double bit errors is referred to as a (SEC-DED) code. In order for a code to be (SEC-DED) its H matrix must have the following properties: (1) all columns are non-zero and distinct, (2) all columns are of odd weight. With this code, a syndrome of odd weight indicates a single bit correctable error, while an even weight, non-zero syndrome indicates an uncorrectable error.

Linear codes can also be used to detect nibble (4-bit) errors. A code that is capable of correcting single bit errors, detecting double bit errors and detecting single b-bit errors is referred to as a (SEC-DED-SbED) code. Codes for b=4 have received extensive study since they can be used to detect failures in memories constructed from memory devices that are 4-bits wide. For these codes, the columns of the H matrix are arranged to give unique syndrome patterns for the b-bit errors, and are typically not in systematic form.

In order to simplify the encoding and decoding circuitry in the use of linear codes, a class of codes has been defined in which the H matrix is constructed by cyclic shifting (i.e., rotating) the rows of the generator submatrix. These codes are called "rotational codes", and have a symmetry that allows the encoding and decoding circuits to be implemented with identical subcircuits specified by the generating submatrix, each by simply altering the input and output connections, respectively.

The amount of encoding and decoding circuitry required for a linear code can be determined by examining its H matrix. The number of 1's in a row determines the width (i.e., the number of inputs) of each of these circuits. For example, if there are 35 binary 1's in a row i, then the circuit required to compute syndrome bits $s_i$ is a 35-input exclusive OR tree. In addition, the arrangement and nature of the columns in the H matrix determines the complexity of the error classification circuitry.

In terms of well-known conventional codes, there is a linear (72, 64) SEC-DED-SbED code which has a weight of 27 for all rows of H, but this code is not rotational. There is also a (72, 64) SEC-DED-SbED code that is rotational, but the row weight is 31, thereby increasing the complexity of its corresponding circuits. Hence, it would be desirable to provide a (72, 64) SEC-DED-S4ED rotational error correction code which has an equal row weight of 27 and a simplified error classification scheme.

It is therefore an object of the present invention to provide a (72, 64) SEC-DED-S4ED error correction code having the following characteristics:

(1) All rows have weight 27 so as to reduce the complexity of the encoding and decoding circuits.

(2) A simple error classification scheme that reduces the complexity of the error classification circuitry.

(3) A rotational property which enables the code to be computed in two halves with the same circuit or to be folded into a (36, 32) burst code.

SUMMARY OF THE INVENTION

To accomplish these and other objectives, the present invention provides a computer system which employs a (72, 64) SEC-DED-S4ED rotational error control code. The H matrix for the code utilized in the present invention is shown in FIG. 4(a). As can be seen, all columns of H are linearly independent and have an odd weight, with each 4-bit wide column of the H matrix being arranged to allow detection of 4-bit byte errors. One and two bit errors are covered by the SEC-DED property, whereas triple errors generate an odd syndrome of weight 5 that is not equal to any of the weight 5 columns in H. Additionally quadruple errors give a non-zero, even weight syndrome.

The check bits C0, C1, C2, C3, C4, C5, C6, C7 of the error correction code utilized in the present invention reside in columns 71, 63, 26, 34, 35, 27, 62 and 70, respectively. With this arrangement of check bits and data bits, the code can (1) detect and correct single bit errors since each column is unique, (2) detect double bit errors since each column has an odd weight, (3) detect three bit errors within a nibble since such errors will result in a syndrome s(v) that has one half with weight 2 and one half with weight 3, and (4) detect four bit errors within a nibble since such errors will result in a syndrome s(v) that cannot sum to zero.

The encoding circuit implemented in one embodiment of the present invention comprises 8 different 26 input exclusive OR gate trees, with each tree having three levels comprising 8, 3 and 1–3 input XOR gates, respectively, and one 2-input XOR gate at the first level. The syndrome generation circuit comprises 8 different 27 input exclusive OR gate trees, with each tree having three levels comprising 9, 3 and 1–3 input XOR gates, respectively.

With respect to the implementation of the above described (72, 64) SEC-DED-S4ED rotational error control code, in one embodiment the code is employed in a computer system having a single 72-bit data path, although it may further be used in a computer system having 72 bits split between two 36-bit data paths, or alternatively, in a computer system having a single 36-bit data path.

BRIEF DESCRIPTION OF THE DRAWINGS

The objects, features and advantages of the present invention will become apparent from the following detailed description in which:

FIGS. 1(a) and 1(b) are a generalized systematic form of a generator matrix G and a parity matrix H, respectively, used to encode an input data word d into a code word v.

FIG. 4(a) is the parity matrix H for the (72, 64) SEC-DED-S4ED rotational error control code in one embodiment of the present invention.

FIG. 4(b) is the parity matrix H for the conventional Fujiwara (56,48) SEC-DED-S4ED rotational error control code.

DETAILED DESCRIPTION OF THE INVENTION

Figure 2:
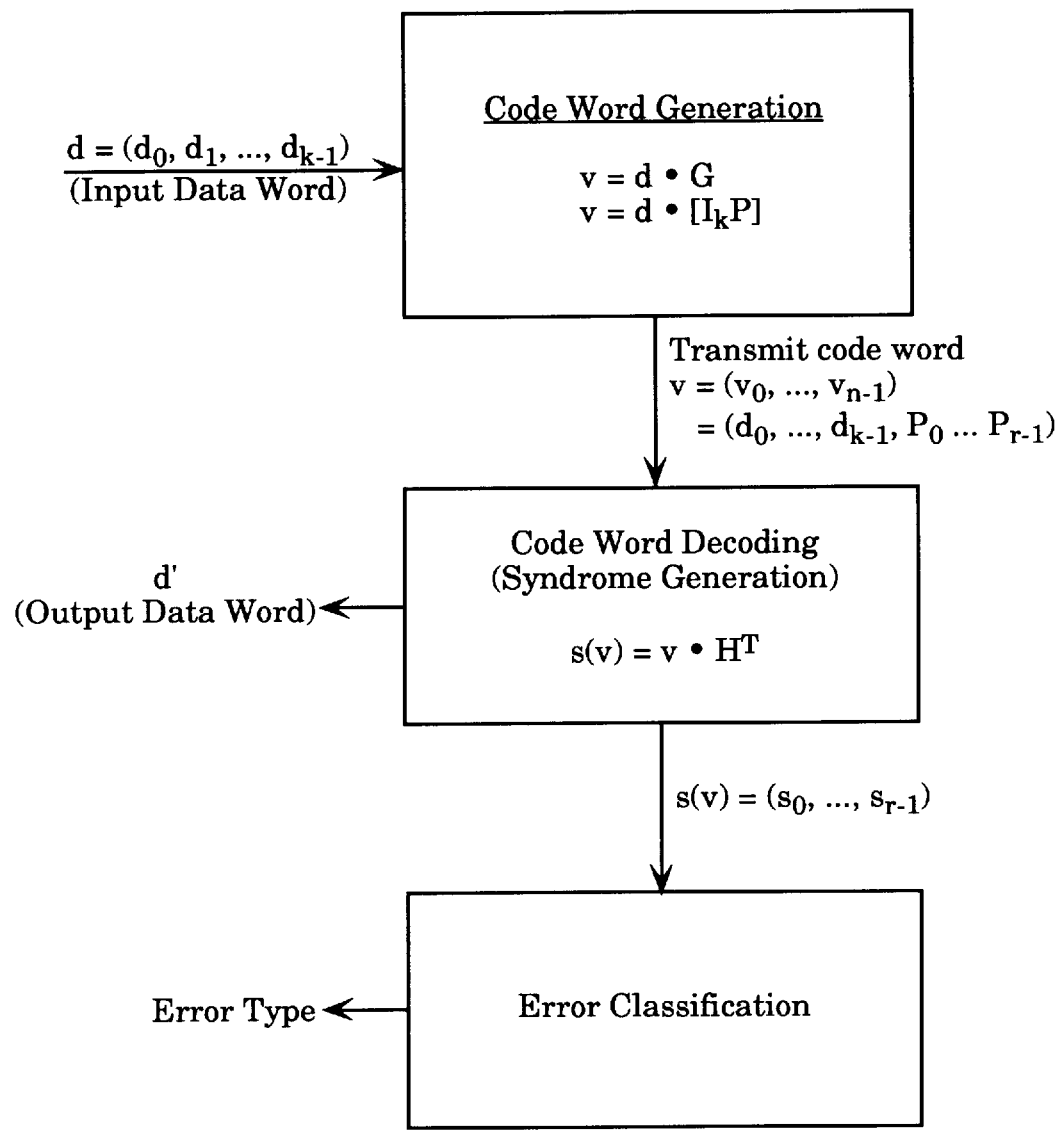
FIG. 2 is a block diagram showing the encoding, decoding and syndrome generation processes for a linear error control code.
Figure 3A:
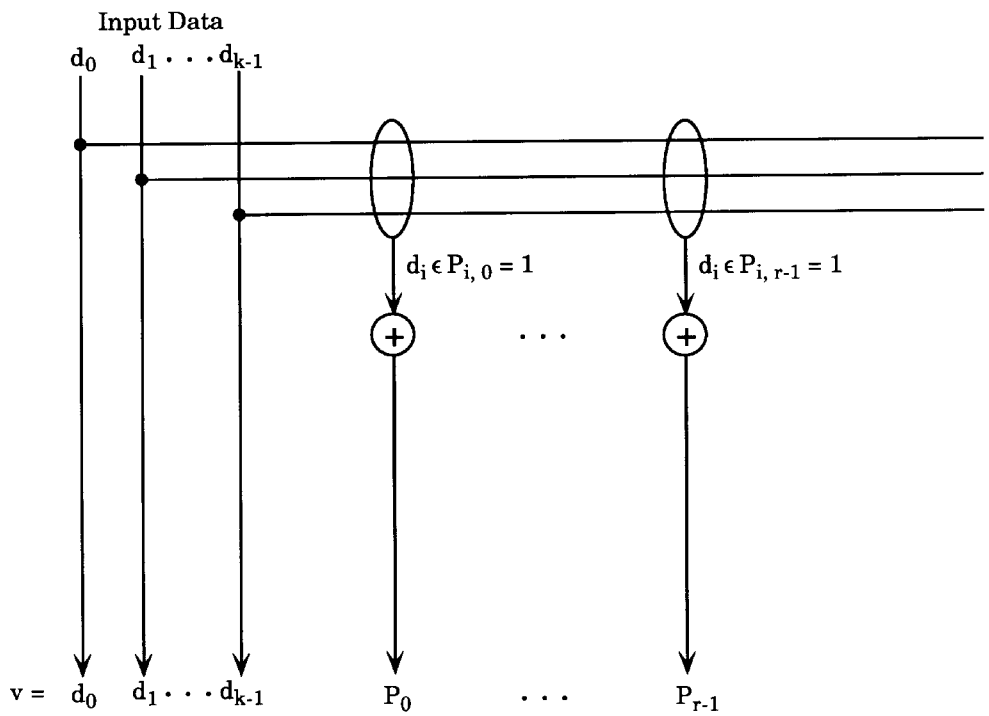
FIG. 3(a) is a diagram showing the combinational logic for a conventional parallel encoder used to generate a systematic code word v.
Figure 3B:
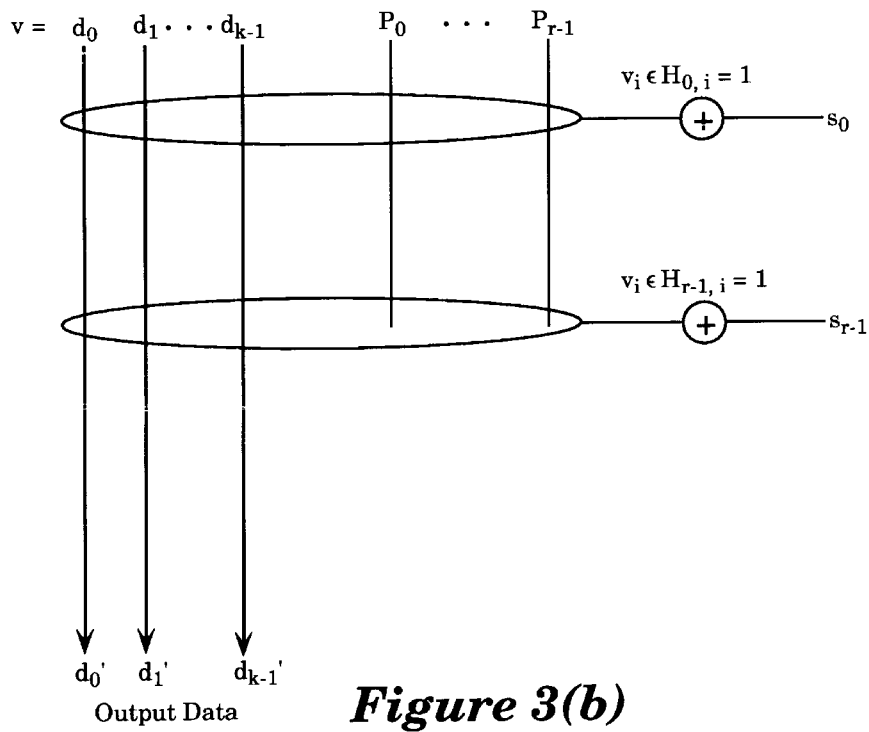
FIG. 3(b) is a diagram showing the combinational logic for a conventional parallel decoder used to generate syndrome bits for a code word v.

A (72, 64) SEC-DED-S4ED rotational error control code for a computer system is described. In the following description, numerous details such as specific equations, electronic components and circuitry, etc., are given in order to provide a thorough understanding of the present invention. It will be obvious, however, to one skilled in the art that not all the details given are required to practice the present invention. In other instances, well-known components, features, methods and the like are not set forth in detail in order to avoid obscuring the description of the present invention.

Figures 4A, 4B:
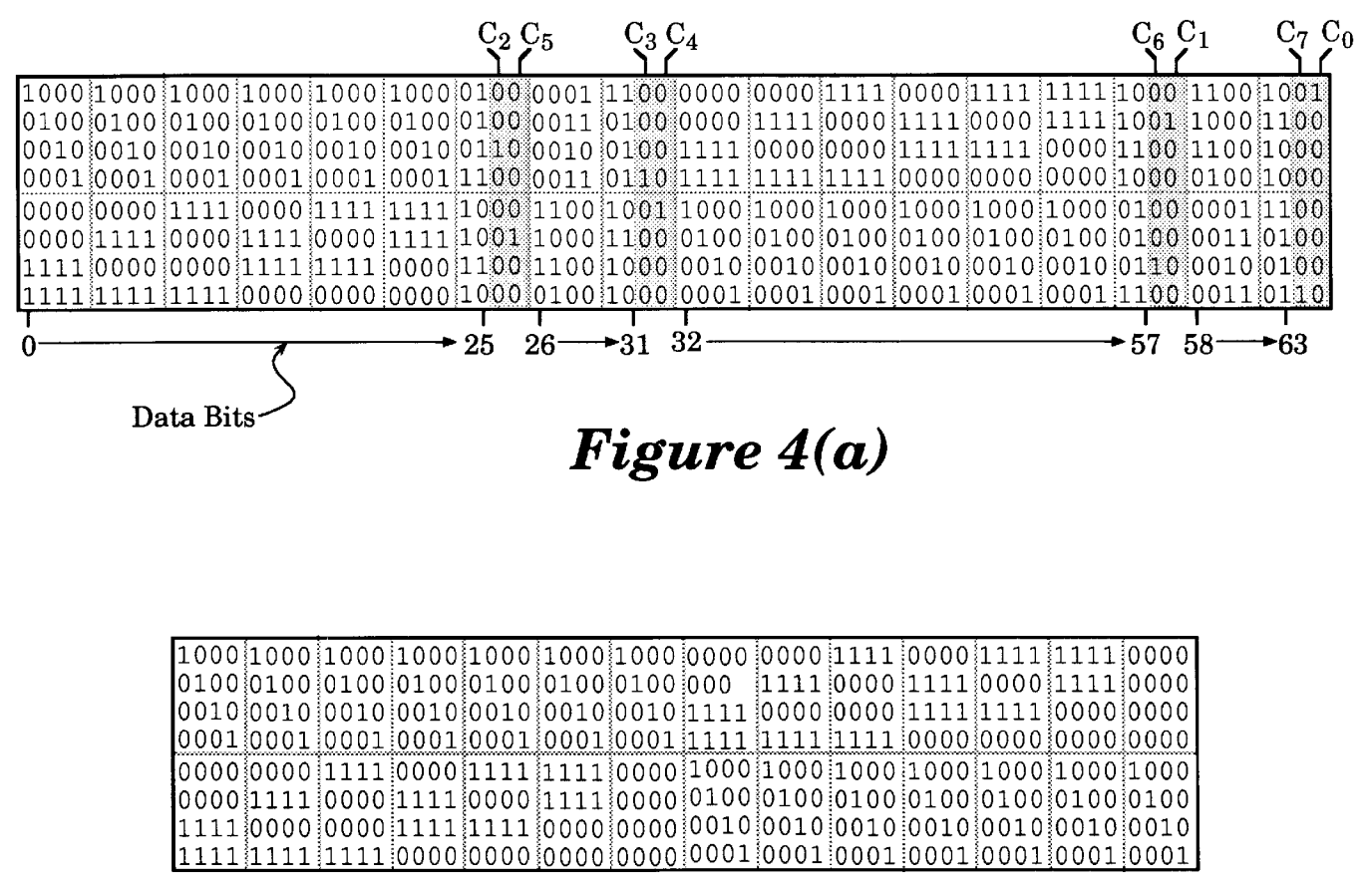

The H matrix for the code utilized in the present invention is shown in FIG. 4(a). This (72, 64) SEC-DED-S4ED error control code is an extension of the Fujiwara (56,48) SEC-DED-S4ED rotational code shown in FIG. 4(b). With respect to the H matrix utilized in the present invention, all columns are linearly independent and have an odd weight. These properties provide the SEC-DED capabilities of the code. In additional, each 4-bit wide column of the H matrix is arrange to allow detection of 4-bit errors (S4ED). One and two bits errors are covered by the SEC-DED property, triple errors generate an odd syndrome of weight 5 that is not equal to any of the weight 5 columns in H, and quadruple errors give a non-zero, even weight syndrome.

In order to develop a code that can provide coverage over 64 bits of data in addition to detecting errors within a 4-bit nibble, the columns of the Fujiwara (56, 48) code were extended to 72 columns by means of selecting additional column vectors for the H matrix that retain the overall properties of the code. However, these column vectors were not generated by the methods used to construct the original Fujiwara code. The additional column vectors were selected from 1, the eight weight-3 columns not used in the Fujiwara (56, 48) code (out of the 56 weight-3 columns possible), 2) the eight weight-5 columns (out of the 56 weight-5 columns possible) that do not have one half of weight 2 and one half of weight 3 (these would alias to triple errors within a nibble), and 3) the eight weight-1 columns.

Referring again to FIG. 4(a), the check bits C0, C1, C2, C3, C4, C5, C6, C7 of the resulting (72, 64) code reside in columns 71, 63, 26, 34, 35, 27, 62 and 70, respectively. With this arrangement of check bits and data bits, the (72, 64) code can (1) detect and correct single bit errors since each column is unique, (2) detect double bit errors since each column has an odd weight, (3) detect three bit errors within a nibble since such errors will result in a syndrome s(v) that has one half with weight 2 and one half with weight 3, and (4) detect four bit errors within a nibble since such error will result in a syndrome s(v) that cannot sum to zero. Hence, the errors can be classified as follows:

(1) If s(v)=0, this indicates that no error has occurred.
(2) If s(v)≠0, this indicates an error has occurred of the following type:
   A) a correctable, single error (is assumed) when s(v) is odd and does not satisfy the properties of a syndrome for a three bit error within a nibble,
   B) an uncorrectable, even-numbered error when s(v) is even, and
   C) an uncorrectable, three bit error within a nibble when one half of s(v) (either s[7:4] or s[3:0]) has weight 2 and the other half of s(v) has weight 3.

Figure 5:
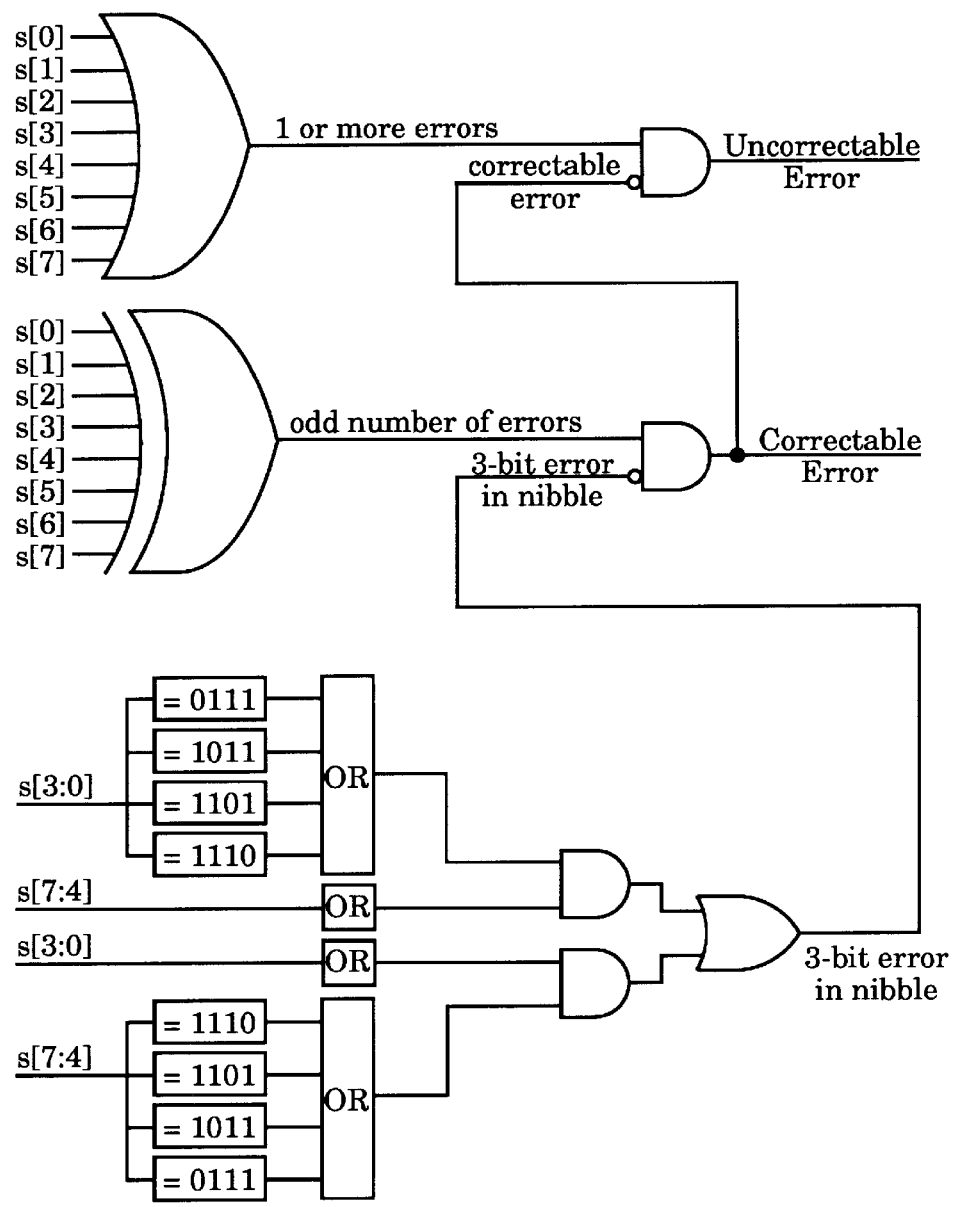
FIG. 5 is a diagram of the error classification circuit implemented in one embodiment of the present invention.

The circuit used to implement the error classification scheme according to one embodiment of the present invention is shown in FIG. 5. Note that this circuit is an alternative implementation of the above described error classification scheme wherein in the last class of errors (the uncorrectable, three bit errors), the weight 2 requirement is relaxed for one half of the syndrome s(v) by requiring only that half of the syndrome s(v) have a non-zero weight. That is, the check for weight 2 in one half of the syndrome s(v) is replaced with a check for a non-zero weight in the same half of the syndrome s(v). This reduces the circuit at the expense of admitting some general triple errors to alias for triple errors in a nibble, which is an acceptable trade-off.

Figure 6A:
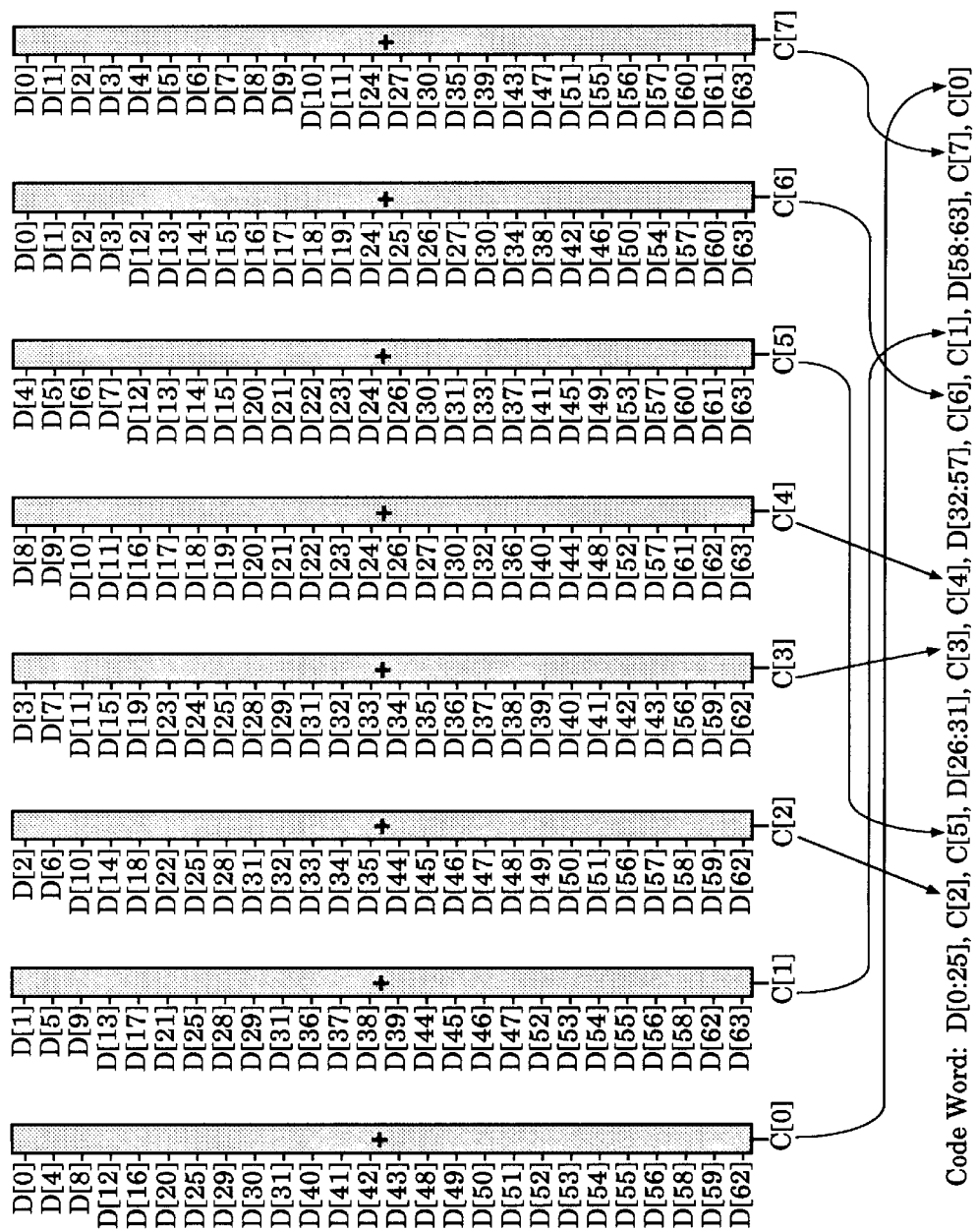
FIG. 6(a) is a diagram of the encoding circuit implemented in one embodiment of the present invention.
Figure 6B:
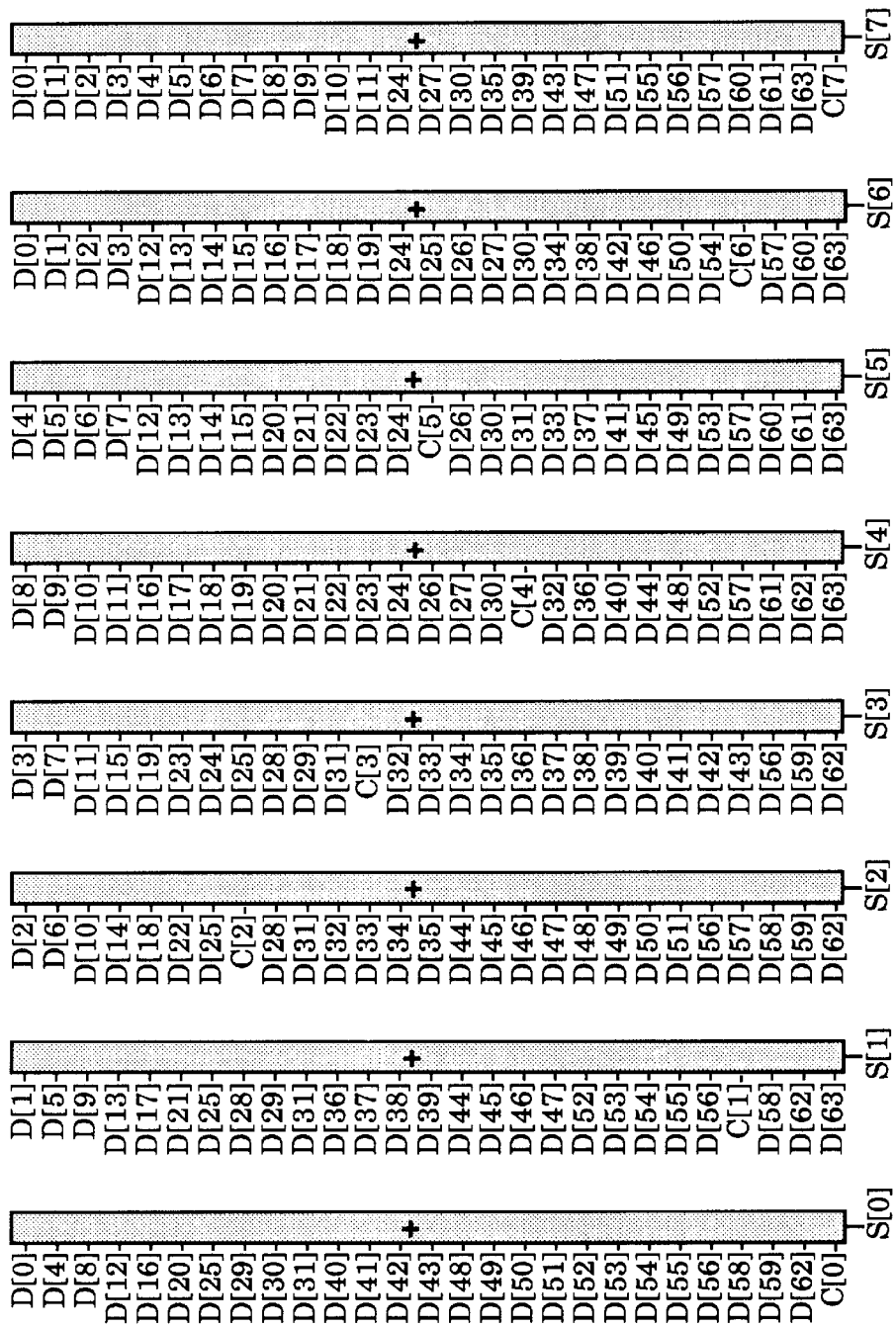
FIG. 6(b) is a diagram of the decoding (or syndrome generation) circuit implemented in one embodiment of the present invention.

The encoding circuit implemented in one embodiment of the present invention is shown in FIG. 6(*a*). As shown, this circuit comprises 8 different 26 input exclusive OR (or XOR) gate trees (each tree being represented by a shaded rectangular box), with each tree having three levels comprising 8, 3 and 1–3 input XOR gates, respectively, in addition to one 2-input XOR gate at the first level. FIG. 6(*b*) shows the syndrome generation circuit implemented for the code utilized in the present invention. This circuit comprises 8 different 27 input exclusive OR gate trees, with each tree having three levels comprising 9, 3 and 1–3 input XOR gates, respectively.

Figure 7:
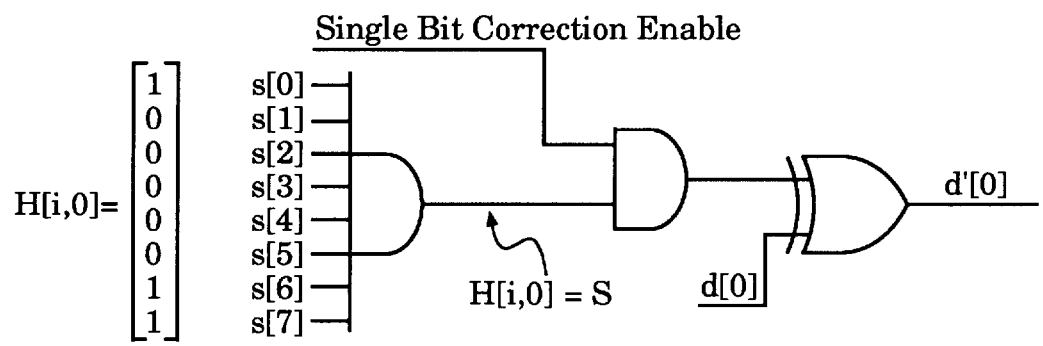
FIG. 7 is a diagram of the single bit, error correction circuit implemented in one embodiment of the present invention.

The process of single bit error correction is illustrated in FIG. 7 for the first column of the H matrix. In general, the circuit compares the computed syndrome to a column of the H matrix. If the syndrome matches, then the code word bit at this position is in error and is inverted.

With respect to the implementation of the above described (72, 64) SEC-DED-S4ED rotational error control code, the code may be utilized in a computer system having a single 72-bit data path, in a computer system having 72 bits split between two 36-bit data paths, or in a computer system having a single 36-bit data path. Preferably, the present invention is in a computer system having a single 72-bit data path where the implementation follows the description and circuitry given above.

In the case of a split 72-bit data path, the rotational property of the code allows the normally-used, two (split) data path components (i.e., first and second receiving circuits) of the computer system to be implemented using the same circuitry. In this way, each of the two 32 bit transfers are input to the same decoding circuitry so as to computes partial sums for check bits and syndromes (i.e., s[3:0] for the first transfer and s[7:4] for the second transfer). However, either the first or second transfer must be inverted by rotating the bits in the way the halves of the H matrix are rotated (i.e., implementing the input connections to switch the bits in the first half of each column (as a whole) of the H matrix with the second half of each column (as a whole), as is known in the art). The circuit then combines the partial sums to generate the check bits or syndrome. After this, error classification and correction proceeds as described above. To compute the partial check bit sum (bits 0 to 7), the encoding circuit uses 8 XOR trees having widths (i.e., the number of inputs) of 9, 9, 9, 11, 16, 16, 16, and 14, respectively. To compute the partial syndrome (bits 0 to 7), the decoding circuit uses 8XOR trees having widths of 10, 10, 10, 12, 17, 17, 17, and 15, respectively. The partial sums are then combined using eight 2-input XOR gates.

In the case of a 36-bit data path, the 72-bit code words are transferred in two 36-bit cycles. We refer to this as a "folded ECC code" which is made possible due to the rotational property of the code. This is implemented using a single 36-bit input XOR gate circuit that computes partial sums, as in the previous case, but instead of computing the partial sums in parallel, they are computed in sequence. Because the 72-bit code words are written and read in two cycles, errors in the common data path are projected into both halves of the code word. For example, if a single driver in a memory device fails it will appear as a double bit error.

Accordingly, the present invention provides a new computer system employing a (72, 64) SEC-DED-S4ED rotational error control code which minimizes the gate count and time for both code generation and syndrome computation, allows simplified error classification, and has the rotational property so as to enable the code to be computed in two halves with the same circuit or in two cycles with half of the circuit.

While the invention has been described in conjunction with the exemplary embodiment it is evident that numerous alternatives, depictions, variations and uses will be apparent to those skilled in the art in light of the foregoing description. Thus, it is understood that the invention is not to be limited by the foregoing illustrative details, but rather is to be defined by the appended claims.

I claim:

1. A decoder comprising:
   a syndrome circuit to receive a 72-tuple y with components in GF(2) to provide a syndrome s in GF(2);
   wherein s=Hy (when y is expressed in column vector form) and H is a 8 by 72 matrix in GF(2) given by $$H = \begin{bmatrix} H_1 & H_2 \\ H_2 & H_1 \end{bmatrix},$$

where $H_i$, i=1, 2, are each 4 by 36 matrices in GF(2) given by $$H_1 = \begin{bmatrix} 10001000100010001000100001000011100 \\ 01000100010001000100010000110100 \\ 00100010001000100010001001100100100 \\ 00010001000100010001000110000110110 \end{bmatrix},$$

$$H_2 = \begin{bmatrix} 00000000111100001111111100011001001 \\ 00001111000011110000111110011001100 \\ 11110000000011111111100001100110100 \\ 11111111111000000000001000010010100 \end{bmatrix}.$$

2. The decoder as set forth in claim 1, further comprising:
   a first circuit to provide a signal indicative of whether a first group of four bits of s has weight three, and to provide a signal indicative of whether a second group of four bits of s has weight three, the first and second groups of four bits representing all eight bits of s; and
   a second circuit to provide a signal indicative of whether s has an odd weight.

3. The decoder as set forth in claim 2, wherein the first circuit is to provide a signal indicative of whether the first group of four bits of s has weight two, and to provide a signal indicative of whether the second group of four bits of s has weight two.

4. The decoder as set forth in claim 2, wherein the first circuit is to provide a signal indicative of whether the first group of four bits of s has a weight of at least one, and to provide a signal indicative of whether the second group of four bits of s has a weight of at least one.

5. A decoder comprising:
   a syndrome circuit to receive a 72-tuple y with components in GF(2) to provide a syndrome s in GF(2) where s=Hy (when y is expressed in column vector form) and where H is a 8 by 72 matrix in GF(2);
   wherein the decoder is to provide a signal indicating a single bit error if there is one bit error in the 72-tuple y;
   wherein the decoder is to provide a signal indicating a double error if there are two bit errors in the 72-tuple y;
   wherein the decoder is to provide a signal indicating a nibble error if there is a four-bit error pattern in the 72-tuple y, the four-bit error pattern beginning at $[y]_i$, where i belongs to the set $\{4n, 0 \leq n \leq 17\}$;
   wherein the matrix H is such that each row of H has weight 27, and the matrix H has rotational symmetry so that $$H = \begin{bmatrix} H_1 & H_2 \\ H_2 & H_1 \end{bmatrix},$$

where $H_i$, i=1, 2, are each 4 by 36 matrices.

6. The decoder as set forth in claim 5, wherein the $H_i$, i=1, 2, are each given by $$H_1 = \begin{bmatrix} 1000100010001000100010000110000011100 \\ 0100010001000100010001000100010000110100 \\ 0010001000100010001001100000100100 \\ 0001000100010001000100011100000110110 \end{bmatrix},$$

$$H_2 = \begin{bmatrix} 0000000011110000111111111000110001001 \\ 0000111100001111000011111001100001100 \\ 1111000000001111111100001100110001000 \\ 1111111111100000000000100001001000 \end{bmatrix}.$$

7. A decoder comprising:
   a syndrome circuit to receive a 36-tuple $y_1$ with components in GF(2) and a 36-tuple $y_2$ with components in GF(2); the syndrome circuit to provide a first partial syndrome $s_1$ in GF(2), a second partial syndrome $s_2$ in GF(2), and a syndrome s according to $s = s_1 + s_2$ in GF(2));
   wherein the syndrome circuit is to provide $s_1$ according to $$s_1 = \begin{bmatrix} H_1 \\ H_2 \end{bmatrix} y_1,$$

in GF(2) (when $s_1$ and $y_1$ are expressed in column vector form), where $H_i$, i=1, 2, are each 4 by 36 matrices in GF(2);
   wherein the syndrome circuit is to provide $s_2$ according to $$s_2 = \begin{bmatrix} p_2 \\ p_1 \end{bmatrix},$$

(when $s_2$, $p_1$, and $p_2$ are expressed in column vector form), where $p_1$ and $p_2$ are each 4-tuples, wherein $p_1$ is the first four bits of an 8-tuple p and $p_2$ is the second four bits of the 8-tuple p;
   wherein the syndrome circuit is to provide the 8-tuple p according to $$p = \begin{bmatrix} H_1 \\ H_2 \end{bmatrix} y_2,$$

in GF(2) (when $y_2$ is in column vector form);
   wherein $$H_1 = \begin{bmatrix} 1000100010001000100010000110000011100 \\ 0100010001000100010001000100010000110100 \\ 0010001000100010001001100000100100 \\ 0001000100010001000100011100000110110 \end{bmatrix},$$

$$H_2 = \begin{bmatrix} 0000000011110000111111111000110001001 \\ 0000111100001111000011111001100001100 \\ 1111000000001111111100001100110001000 \\ 1111111111100000000000100001001000 \end{bmatrix}.$$

8. An encoder to generate a set of 72-tuple codewords, the encoder comprising:
   a generator circuit, wherein for any codeword x belonging to the set of 72-tuple codewords, when in column vector form, satisfies 0=Hx where H is a 8 by 72 matrix in GF(2) given by $$H = \begin{bmatrix} H_1 & H_2 \\ H_2 & H_1 \end{bmatrix},$$

where $H_i$, i=1, 2, are each 4 by 36 matrices in GF(2) given by $$H_1 = \begin{bmatrix} 1000100010001000100010000110000011100 \\ 0100010001000100010001000100010000110100 \\ 0010001000100010001001100000100100 \\ 0001000100010001000100011100000110110 \end{bmatrix},$$

$$H_2 = \begin{bmatrix} 0000000011110000111111111000110001001 \\ 0000111100001111000011111001100001100 \\ 1111000000001111111100001100110001000 \\ 1111111111100000000000100001001000 \end{bmatrix}.$$

9. A set of at least one processor, comprising:
   an encoder to generate a set of 72-tuple codewords, wherein for any codeword x belonging to the set of 72-tuple codewords, when in column vector form, satisfies 0=Hx; and
   a decoder circuit to receive a 72-tuple y with components in GF(2) to provide a syndrome s in GF(2) where s=Hy (when y is expressed in column vector form);
   wherein H is a 8 by 72 matrix in GF(2) given by $$H = \begin{bmatrix} H_1 & H_2 \\ H_2 & H_1 \end{bmatrix},$$

where $H_i$, i=1, 2, are each 4 by 36 matrices in GF(2) given by $$H_1 = \begin{bmatrix} 1000100010001000100010000110000011100 \\ 0100010001000100010001000100010000110100 \\ 0010001000100010001001100000100100 \\ 0001000100010001000100011100000110110 \end{bmatrix},$$

$$H_2 = \begin{bmatrix} 0000000011110000111111111000110001001 \\ 0000111100001111000011111001100001100 \\ 1111000000001111111100001100110001000 \\ 1111111111100000000000100001001000 \end{bmatrix}.$$

* * * * *

UNITED STATES PATENT AND TRADEMARK OFFICE
CERTIFICATE OF CORRECTION

PATENT NO.    : 5,856,987
DATED         : January 5, 1999
INVENTOR(S)   : Holman It is certified that error appears in the above-identified patent and that said Letters Patent is hereby corrected as shown below:

Column 6,
Line 43, delete "$H_1$" and insert -- $H_i$ --.

Signed and Sealed this

Thirteenth Day of May, 2003

JAMES E. ROGAN
*Director of the United States Patent and Trademark Office*